United States Patent
Usui et al.

(10) Patent No.: US 11,356,054 B2
(45) Date of Patent: Jun. 7, 2022

(54) OPTICAL POWER SUPPLY CONVERTER

(71) Applicant: KYOTO SEMICONDUCTOR CO., LTD., Kyoto (JP)

(72) Inventors: Ken Usui, Kyoto (JP); Etsuji Omura, Kyoto (JP)

(73) Assignee: KYOTO SEMICONDUCTOR CO., LTD., Kyoto (JP)

( * ) Notice: Subject to any disclaimer, the term of this patent is extended or adjusted under 35 U.S.C. 154(b) by 0 days.

(21) Appl. No.: 17/046,252

(22) PCT Filed: Jul. 6, 2020

(86) PCT No.: PCT/JP2020/026395
§ 371 (c)(1),
(2) Date: Jul. 23, 2021

(87) PCT Pub. No.: WO2022/009265
PCT Pub. Date: Jan. 13, 2022

(65) Prior Publication Data
US 2022/0006423 A1    Jan. 6, 2022

(51) Int. Cl.
*H02S 40/22*   (2014.01)
*H01L 31/0232*   (2014.01)

(52) U.S. Cl.
CPC .......... *H02S 40/22* (2014.12); *H01L 31/0232* (2013.01); *H01L 31/02325* (2013.01); *H01L 31/02327* (2013.01)

(58) Field of Classification Search
CPC ............. H01L 31/0232; H01L 31/0216; H01L 31/02325; H01L 31/02327; H02S 40/22
See application file for complete search history.

(56) References Cited

U.S. PATENT DOCUMENTS

| | | | |
|---|---|---|---|
| 4,358,676 A | * | 11/1982 | Childs ............... H01L 31/02327 250/214 R |
| 2007/0121696 A1 | * | 5/2007 | Ishii ........................ H01L 33/60 372/99 |
| 2011/0108081 A1 | | 5/2011 | Werthen et al. |
| 2019/0348549 A1 | | 11/2019 | Davidson |
| 2020/0168749 A1 | | 5/2020 | Nishimura et al. |

FOREIGN PATENT DOCUMENTS

| | | |
|---|---|---|
| CN | 102201482 A | 9/2011 |
| JP | 10-41536 A | 2/1998 |
| JP | 11-163390 A | 6/1999 |
| JP | 2002-151668 A | 5/2002 |
| JP | 2005-294669 A | 10/2005 |
| JP | 2010-114235 A | 5/2010 |
| JP | 2013-229513 A | 11/2013 |
| JP | 2018-56382 A | 4/2018 |
| WO | 2019/021362 A1 | 1/2019 |

* cited by examiner

*Primary Examiner* — Lindsey A Bernier
(74) *Attorney, Agent, or Firm* — Norris McLaughlin, P.A.

(57) ABSTRACT

In the optical power supply converters (1A to 1C) having a semiconductor light receiving element (2) including a light receiving section (15) on a main surface (10a) side of a semiconductor substrate (10), the semiconductor substrate (10) has at least one inclined end surface (10c) that intersects the main surface (10a) at an acute angle, and the light incident on the inclined end surface (10c) is refracted so as to be incident on the receiving section (15).

3 Claims, 4 Drawing Sheets

OPTICAL POWER SUPPLY CONVERTER

TECHNICAL FIELD

The present invention relates to an optical power supply converter that converts light input via an optical fiber cable into an electric current and outputs it.

BACKGROUND ART

It is not possible to supply electric power to electronic devices via a power cable, in special environments such as remote areas without power supply equipment, environments where weak electromagnetic fields generated by power supply make noise, environments that require explosion proof, and environments having ultra-high voltage equipment that has electrical mutual influences. Therefore, an optical power supply converter that sends light to the side of electronic devices via an optical fiber cable and converts the light into an electric current is used.

In order to increase the output of the optical power supply converter, a technique for improving the photoelectric conversion efficiency of an optical power supply converter by means of providing a plurality of light absorption regions having different bandgap energies as in Patent Document 1 is known. Further, for example, as in Patent Document 2, there is known an optical power supply converter in which light receiving units divided in an array are connected in series in order to increase the output voltage.

PRIOR ART DOCUMENTS

Patent Documents

Patent Document #1: Japanese Laid-open Publication 2010-114235.
Patent Document #2: U.S. Patent Application Publication 2011/0108081.

SUMMARY OF THE INVENTION

Problems to be Solved by the Invention

By the way, in order to increase the output of the optical power supply converter, it is also effective to increase the optical input to the optical power supply converter as in Patent Documents 1 and 2 via the optical fiber cable. However, in a general single-mode optical fiber, the diameter of the core through which light propagates is as small as about 10 μm. Therefore, for a large optical input exceeding 1 W, for example, the core may be damaged by the fiber fuse phenomenon, and there is a limit to increasing the optical input.

Therefore, in order to avoid damage to the core, light is transmitted through a plurality of optical fiber cables, and a plurality of optical power supply converters corresponding to these are arranged, or a large-size light receiving device having a plurality of light receiving parts corresponding to the plurality of optical fiber cables are proposed. However, there is a problem that a large installation space is required because a plurality of optical power supply converters are arranged, or the optical power supply converter becomes large because it has a large light receiving element. Further, since an optical power supply converter having a plurality of optical power supply converters or a large light receiving element is required, an increase in manufacturing cost is unavoidable.

An object of the present invention is to provide an optical power supply converter capable of receiving light from a plurality of optical fiber cables without enlarging the size.

Means to Solve the Problems

The present invention presents an optical power supply converter having a semiconductor light receiving element comprising a light receiving section on a main surface side of a semiconductor substrate, for supplying a current generated by converting light incident to the main surface by the light receiving section to outside; wherein the semiconductor substrate has at least one inclined end face that intersects the main surface at an acute angle, and light incident on the inclined end surface from a parallel direction or an oblique direction with respect to the main surface is refracted so as to be incident on the light receiving section, so as to overlap with light incident perpendicular to the main surface.

According to the above configuration, the light perpendicularly incident on the main surface and the light incident on the inclined end surface are superposed on the light receiving section and converted into an electric current by the light receiving section, and supplied to the outside. Therefore, it is possible to receive light emitted from a plurality of optical fiber cables and to convert into electric current without enlarging the size of the optical power supply converter.

In a first preferable aspect of the present invention, a support substrate for supporting the semiconductor light receiving element is provided, the support substrate is provided with a reflecting portion facing the inclined end face, and the reflecting portion is configured to reflect light incident parallel to the light incident perpendicularly to the main surface so as to be incident on the inclined end surface.

According to the above configuration, the light parallel to the light perpendicularly incident on the main surface is reflected by the reflecting portion toward the inclined end face. Therefore, a plurality of optical fiber cables can be arranged so as to emit in a direction perpendicular to the main surface, and since it is not necessary to bend the optical fiber cables, the optical fiber cables can be easily connected and can be connected compactly.

In a second preferable aspect of the present invention, the support substrate is a silicon substrate, and the reflecting portion is formed on a (111) surface of the silicon substrate.

According to the above configuration, since the reflecting portion can be formed flat at a constant inclination angle, it is possible to secure a high incident position accuracy with respect to the inclined end face and form a reflecting portion having a high reflectance. Therefore, since the light reflected by the highly reflective reflecting portion can be incident on the light receiving section with high accuracy, the light emitted from a plurality of optical fiber cables can be received to convert without increasing the size of the optical power supply converter.

Advantages of the Invention

According to the optical power supply converter of the present invention, it is possible to receive light from a plurality of optical fiber cables and convert into electric current without increasing the size of the converter.

DESCRIPTION OF EMBODIMENTS

Best mode for implementing the present invention will now be explained on basis of embodiments.

First Embodiment

Figure 1:
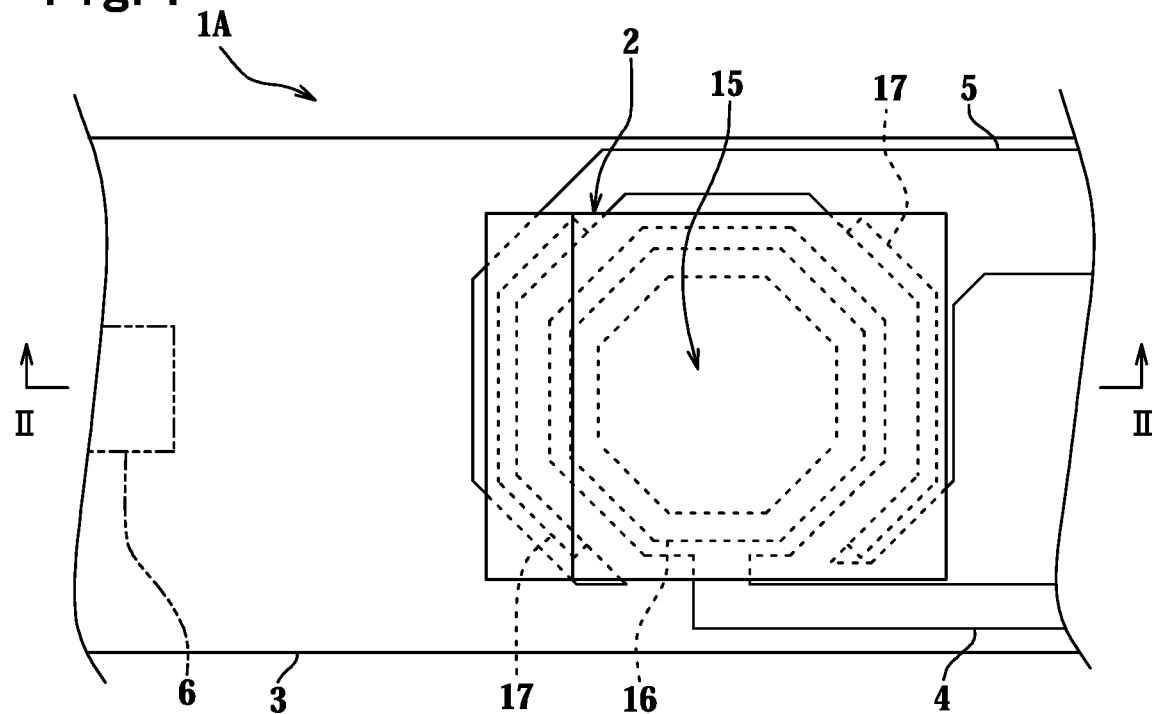
FIG. 1 is a plan view of a main part of an optical power supply converter according to a first embodiment of the present invention.
Figure 2:
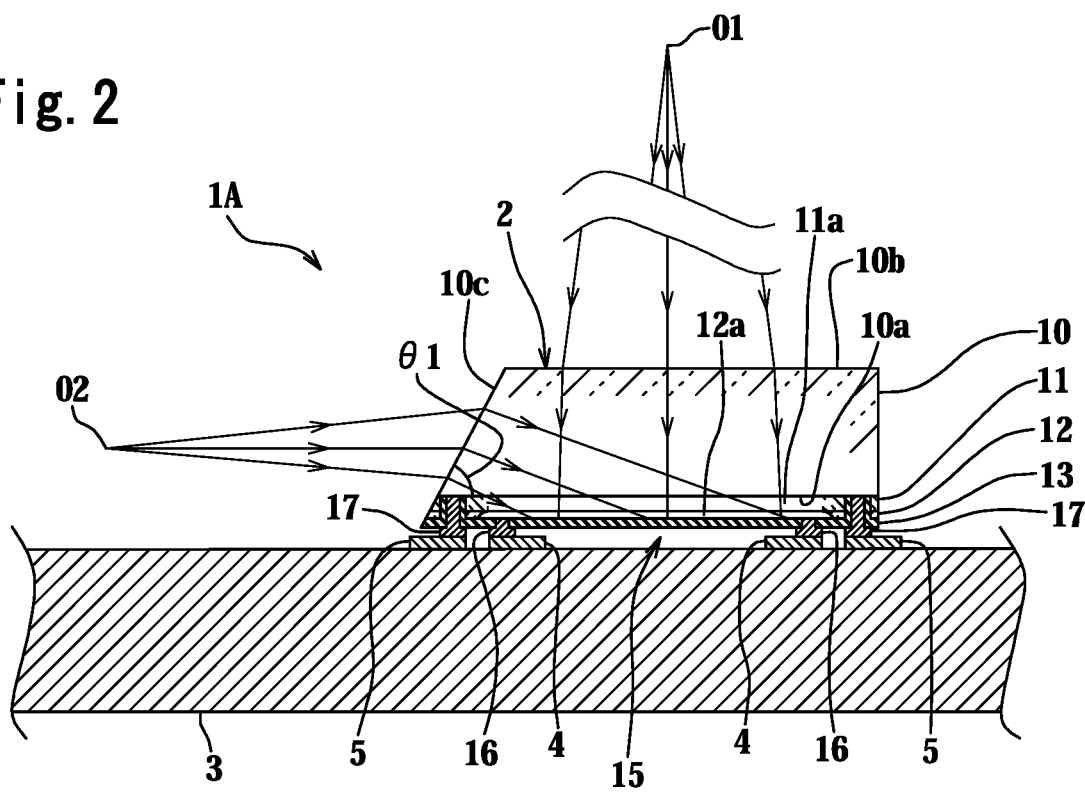
FIG. 2 is a cross-sectional view taken along II-II line of FIG. 1.

As shown in FIG. 1 and FIG. 2, an optical power supply converter 1A has a semiconductor light receiving element 2 and a support substrate 3 that supports the semiconductor light receiving element 2. A pair of wirings 4 and 5 are formed on the support substrate 3. The semiconductor light receiving element 2 receives light (for example, infrared light in a wavelength region of 1 to 1.6 μm) emitted from emission points O1 and O2 corresponding to the emission ends of optical fiber cables 6 etc. and converts into electric current, and supplies the electric power to the outside via a pair of wires 4 and 5.

When defining the (100) surface of a semiconductor substrate 10 which is an n-InP substrate as a main surface 10a, the semiconductor light receiving element 2 comprises a light receiving section 15 (photodiode) having a light absorption region 11a in a InGaAs layer 11 formed on the main surface 10a side and a p-type diffusion region 12a in an n-InP layer 12 formed on the InGaAs layer 11. The n-InP layer 12 is covered with a dielectric film 13 (for example, SiN film, SiO2 film, etc.).

The p-type diffusion region 12a is formed by doping a predetermined region of the n-InP layer 12 with, for example, Zn, and the region of the InGaAs layer 11 in contact with the p-type diffusion region 12a corresponds to the light absorption region 11a. The p-type diffusion region 12a is formed in, for example, a regular octagon when viewed from the main surface 10a side, but may be formed in a polygonal shape including a rectangle or a circle.

The semiconductor light receiving element 2 has an annular electrode 16 formed so as to border the p-type diffusion region 12a and connected to the p-type diffusion region 12a, and a substrate electrode 17 connected to the semiconductor substrate 10 outside the annular electrode 16. The annular electrode 16 is connected to the wiring 4, and the substrate electrode 17 is connected to the wiring 5. Then, a part of the light traveling in the semiconductor substrate 10 and incident on the light absorption region 11a of the light receiving section 15 is converted into an electric current, and the electric power is supplied to the outside from the wirings 4 and 5 via the annular electrode 16 and the substrate electrode 17.

The semiconductor light receiving element 2 is fixed with the main surface 10a side facing the support substrate 3. Then, light is incident on the main surface 10a perpendicularly from the emission point O1 on the back surface 10b side of the semiconductor substrate 10 facing the main surface 10a to reach the light absorption region 11a.

The semiconductor substrate 10 has an inclined end surface 10c formed so as to intersect the main surface 10a at an acute angle. The intersection angle θ1 of the inclined end surface 10c with respect to the main surface 10a can be set to an acute angle, for example, 62°. The inclined end surface 10c is formed by tilting the dicing blade in a posture usually perpendicular to the main surface 10a when dicing the semiconductor substrate 10 in the wafer state with the dicing blade. Light is incident on the inclined end surface 10c in parallel with the main surface 10a, and the light is refracted by the inclined end surface 10c to reach the light absorption region 11a. The inclined end surface 10c is formed on a rough surface having fine irregularities having a height (depth) equal to or higher than the wavelength of the incident light by dicing to reduce reflection of the incident light.

The exit point O1 of the optical fiber cable that emits light that is perpendicularly incident on the main surface 10a is distant by a appropriate distance from the semiconductor light receiving element 2 so that all of the light is incident on the light absorption region 11a in consideration of the divergence angle of the emitted light. Similarly, the position of the exit point O2 of the optical fiber cable that emits the light incident on the inclined end surface 10c is such that the entire light is absorbed in the light absorption region 11a in consideration of the divergence angle of the emitted light and the refraction angle at the inclined end surface 10c.

For example, when the divergence angle is 5° and the intersection angle θ1 is 62°, the refraction angle on the optical axis is 8.4°, and the position of the emission point O2 is 150 μm away from the semiconductor light receiving element 2 so as to enter the light absorption region 11a. In this way, the light incident on the inclined end surface 10c is made to reach the light absorption region 11a so as to overlap the light perpendicularly incident on the main surface 10a, and the amount of light received by the light receiving section 15 is increased to increase the electric current without enlarging the optical power supply converter 1A.

Figure 3:
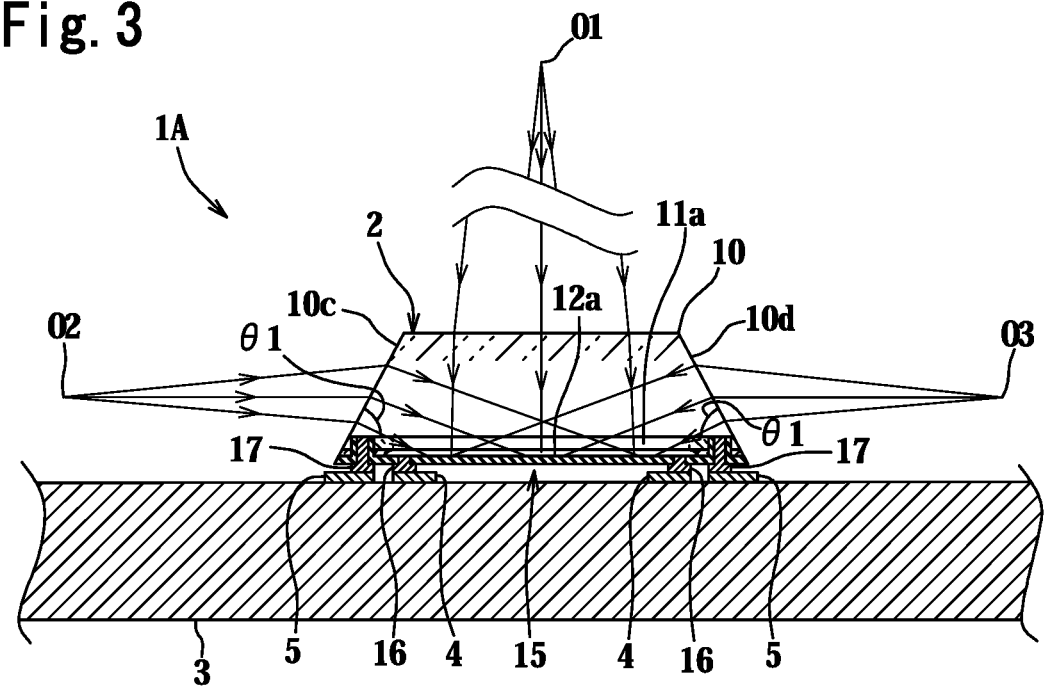
FIG. 3 is a diagram showing an example of an optical power supply converter having a plurality of inclined end faces.

As shown in FIG. 3, the semiconductor substrate 10 may comprise not only the inclined end surface 10c but also a plurality of inclined end surfaces such as an inclined end surface 10d for incident light from the emission point O3. The amount of light received by the light receiving section 15 can be further increased to further increase the output current without enlarging the optical power supply converter 1A. The rectangular semiconductor light receiving element 2 can have four inclined end surfaces corresponding to the four sides at the maximum, but it may be made into a polygon shape such as a hexagon or an octagon so as to form inclined end surfaces corresponding to each side of the polygon.

Figure 4:
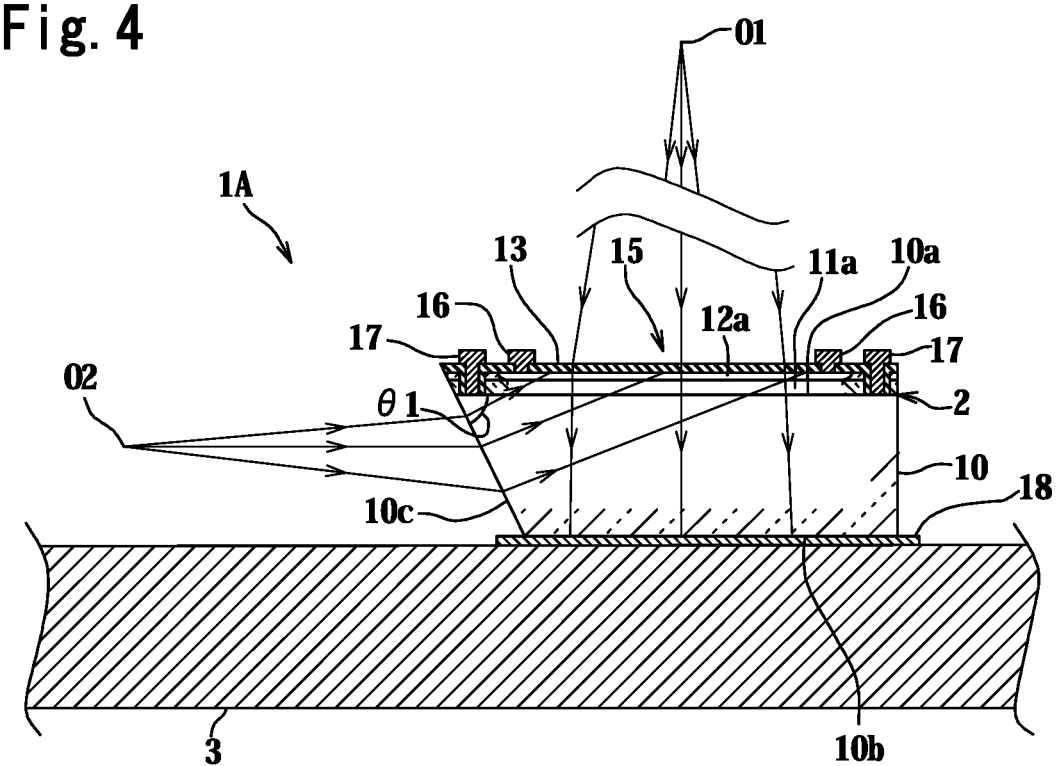
FIG. 4 is a diagram showing an example of an optical power supply converter in which a semiconductor light receiving element is fixed in a direction different from that of FIG. 2.

Further, as shown in FIG. 4, the semiconductor light receiving element 2 may be fixed to the support substrate 3 on the back surface 10b side with, for example, an epoxy-based adhesive 18. In this case, the light perpendicularly incident on the main surface 10a from the emission point O1 is incident on the inside of the annular electrode 16 from the dielectric film 13 side and reaches the light absorption region 11a. On the other hand, the light incident parallel to the main surface 10a from the emission point O2 is refracted by the inclined end surface 10c and reaches the light absorption region 11a.

Therefore, the output current can be increased without enlarging the optical power supply converter 1A by increasing the amount of light received by the light receiving section 15 as in the case of FIG. 2. Further, as in FIG. 3, it is also possible to further increase the output current of the optical power supply converter 1A by injecting light from a plurality of inclined end faces 10c, 10d and the like. Although not shown, the annular electrode 16 and the substrate electrode 17 are connected to the wiring terminals corresponding to the wirings 4 and 5 by wire bonding.

Second Embodiment

The optical power supply converter 1B obtained by modifying a part of the first embodiment will be described. The same reference numerals are given to the parts common to those in the first embodiment, and the description thereof will be omitted.

A plurality of optical fiber cables are usually routed in a bundled state and connected to an optical power supply converter, but since the incident directions are different in the above-described first embodiment, the plurality of optical fiber cables are connected separately. For example, optical fiber cables fixed to the exit points O1 and O2 are routed in a bundled state, one of them is fixed in a posture perpendicular to the main surface 10a at the exit point O1, and the other is fixed in a posture parallel to the main surface 10a at the exit point O2.

At this time, it is difficult to reduce the bending of the optical fiber cable, so the space for bending the optical fiber cable becomes large. Therefore, it is preferable to dispose the optical fiber cable that allows light to enter the main surface 10a perpendicularly from the emission point O1 and the other optical fiber cables in parallel without bending.

Figure 5:
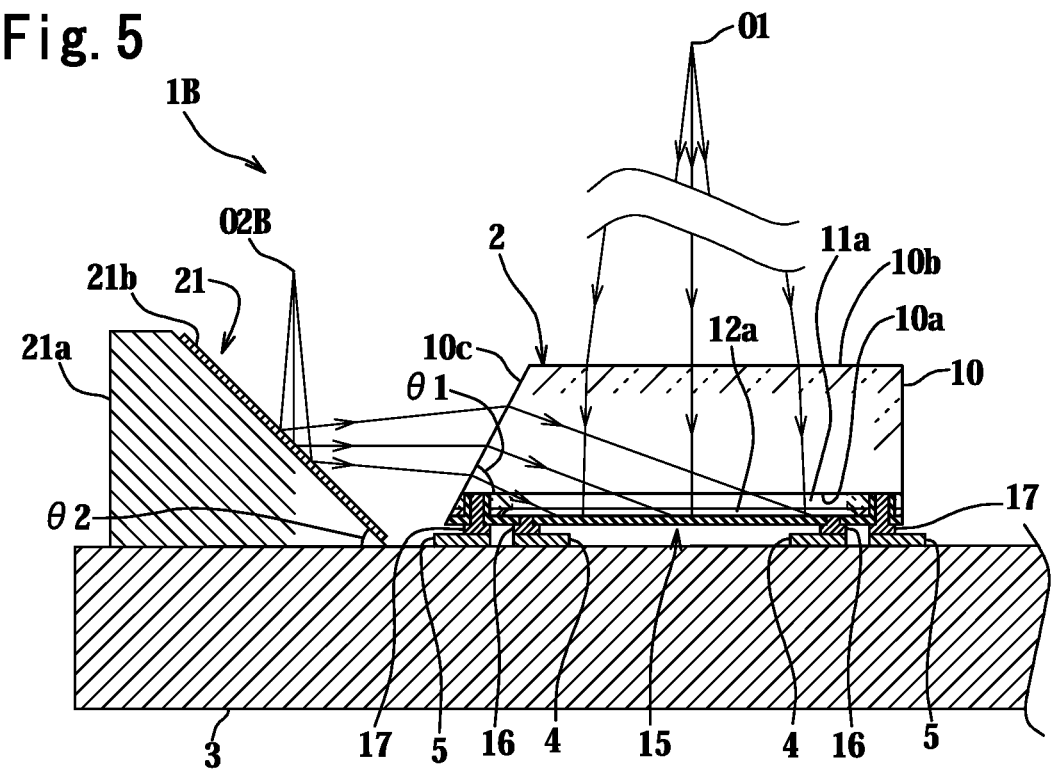
FIG. 5 is a diagram showing an optical power supply converter provided with a reflecting portion according to the second embodiment.

Therefore, for example, as shown in FIG. 5, the optical power supply converter 1B is provided with a reflecting portion 21 facing the inclined end surface 10c on the support substrate 3. The reflective portion 21 includes a reflective film 21b formed of, for example, a metal film containing Au, Al, etc. on the reflective surface of the base material 21a. The reflective surface of the base material 21a is tilted by a predetermined angle θ2 (for example 45°) with respect to the support substrate 3.

The position of the emission point O2B is set so that the incident region on the inclined end surface 10c is the same as in the case of FIG. 2. The emission end of the optical fiber cable in parallel with the optical fiber cable for injecting light perpendicularly to the main surface 10a is arranged at a emission point O2B. As a result, the light incident on the inclined end surface 10c reaches the light absorption region 11a so as to overlap the light perpendicularly incident on the main surface 10a, and the amount of light received by the light receiving section 15 is increased, thereby output electric current is increased without enlarging the optical power supply converter 1B. Since, in the optical power supply converter 1B, incident directions of light from a plurality of optical fiber cables are parallel, it is not necessary to bend the optical fiber cables and can be connected compactly.

Figure 6:
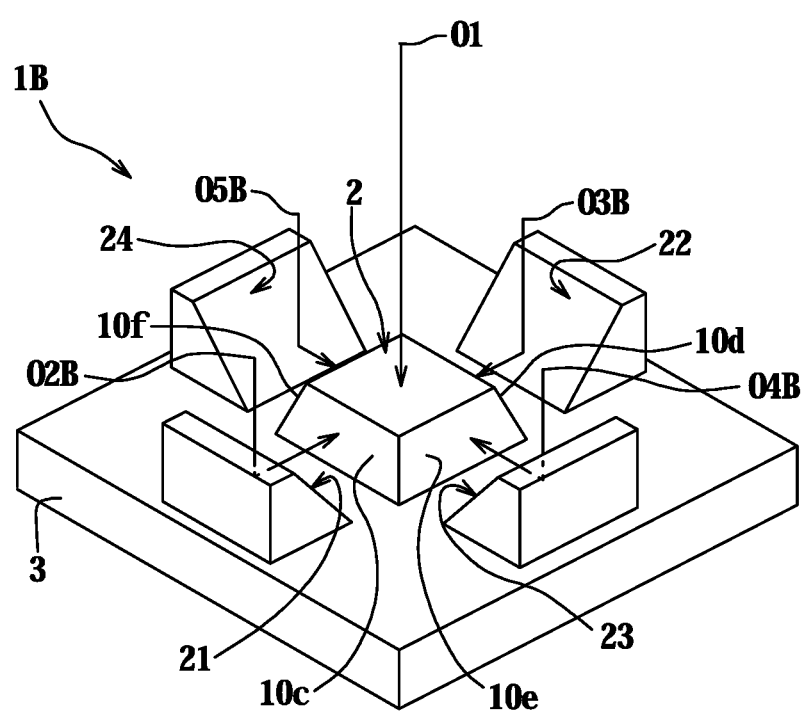
FIG. 6 is a diagram showing an optical power supply converter including a plurality of reflecting portions according to the second embodiment.

Further, as shown in FIG. 6, by disposing the reflecting portions 21 to 24 corresponding to the plurality of inclined end surfaces 10c to 10f, the light receiving amount of the light receiving section 15 is increased and the output electric current of the optical power supply converter 1B can be increased without enlarging the optical power supply converter 1B. Since the incident directions of light from the plurality of optical fiber cables are parallel, the plurality of optical fiber cables can be connected compactly without bending. Further, it may be also easy to arrange a plurality of reflecting portions so as to correspond to each side of the semiconductor light receiving element 2 having a polygonal shape other than the rectangle. The predetermined angle θ2 may be appropriately set according to the incident direction of the light.

Third Embodiment

The optical power supply converter 1C obtained by modifying a part of the second embodiment will be described. The same reference numerals are given to the parts common to those of the second embodiment, and the description thereof will be omitted.

Figure 7:
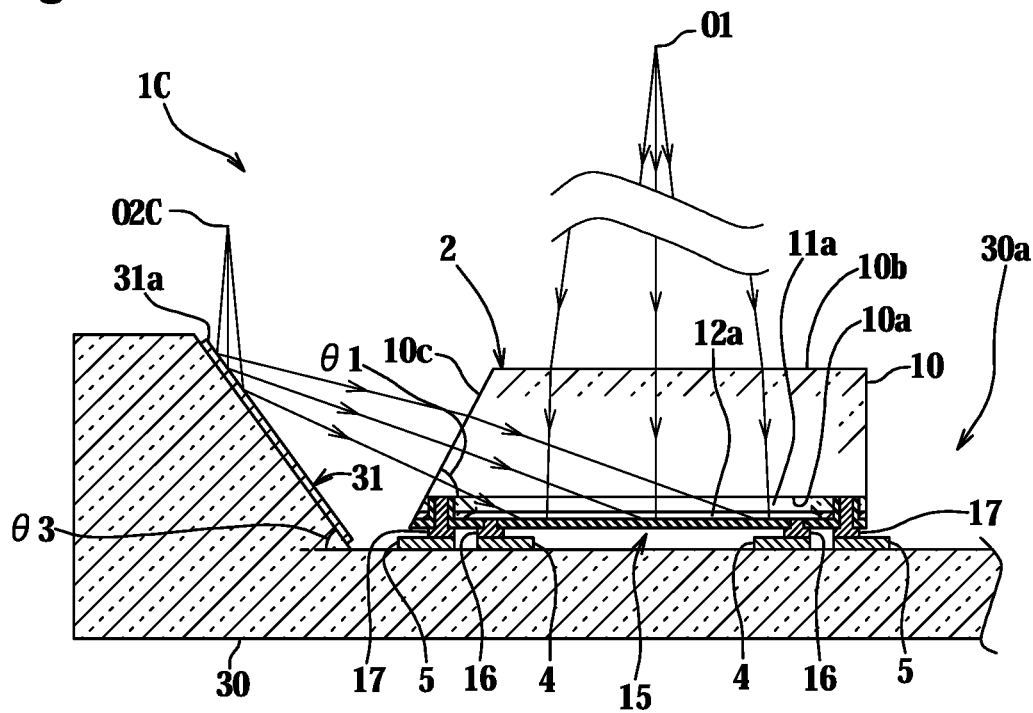
FIG. 7 is a diagram showing an optical power supply converter provided with a reflecting portion according to the third embodiment.

The support substrate 3 of the second embodiment is, for example, a ceramic substrate, but the optical power supply converter 1C has a silicon (Si) substrate 30 instead of the support substrate 3. The top surface of the silicon substrate 30 is the (100) plane, and as shown in FIG. 7, etching is performed from the top surface by anisotropic etching using a known alkaline etching solution (KOH aqueous solution or the like). A recess 30a having an exposed (111) planes are formed. Then, the semiconductor light receiving element 2 is arranged in the recess 30a, and the (111) surface is used as the reflecting portion 31.

The (111) surface of the silicon substrate 30 exposed by anisotropic etching is a smooth surface having an inclination of a predetermined angle θ3 (for example 54.7°) with respect to the (100) plane. The reflecting portion 31 in which the reflecting film 31a is formed on the (111) plane by a metal film containing, for example, Au, Al, etc., reflect the light emitted from the exit point O2C toward the inclined end surface 10c. Additionally, the (111) plane inclined by 45° with respect to the surface can be exposed by anisotropic etching on the silicon substrate 30 whose surface is angled from the (100) plane, and can form a reflecting surface same as in FIG. 4.

An appropriate position of the emission point O2C is set, and the optical fiber cable is arranged at the emission point O2C in parallel with the optical fiber cable that injects light perpendicularly from the emission point O1 to the main surface 10a. The light emitted from the emission point O2C is parallel to the light emitted from the emission point O1 and vertically incident on the main surface 10a, and the light reflected by the reflecting portion 31 travels obliquely with tilt angle 19.4° with respect to the direction parallel to the main surface 10a. Then, the light incident on the inclined end surface 10c is refracted by the inclined end surface 10c and reaches the light absorption region 11a.

As a result, the light incident on the inclined end surface 10c is made to reach the light absorption region 11a so as to overlap the light perpendicularly incident on the main surface 10a, and the amount of light received by the light receiving section 15 is increased, thereby increasing the output electric current without enlarging the optical power supply converter 1C. Since, in the optical power supply converter 1C, incident directions of light from a plurality of optical fiber cables are parallel, it can be connected compactly without bending the optical fiber cables.

Figure 8:
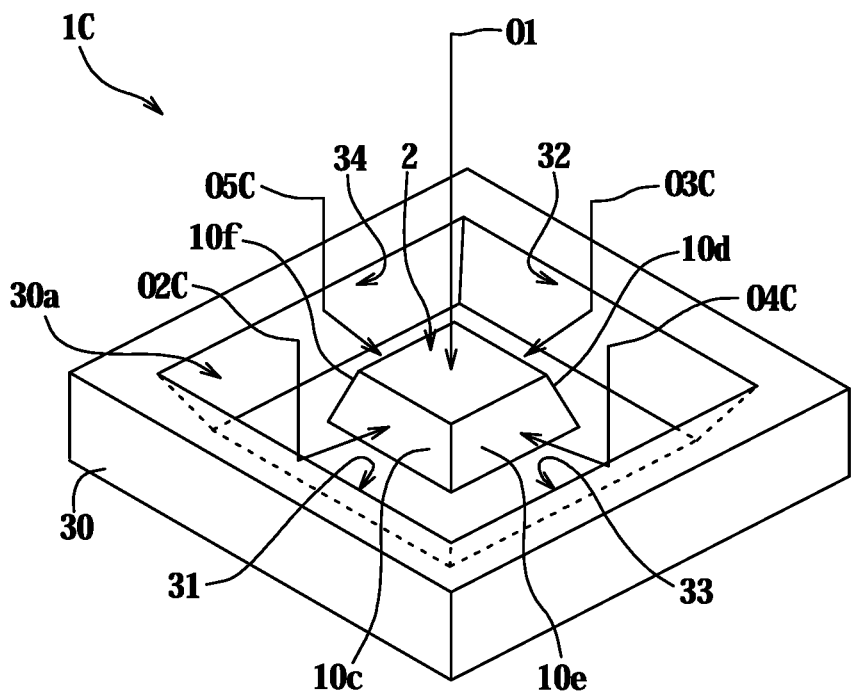
FIG. 8 is a diagram showing an optical power supply converter including a plurality of reflecting portions according to the third embodiment.

Further, as shown in FIG. 8, by exposing four (111) planes having different orientations and forming a recess 30a recessed in a quadrangular pyramid shape, reflecting portions 31 to 34 corresponding to a plurality of inclined end surfaces 10c to 10f are formed. As a result, the light receiving amount of the light receiving section 15 can be increased and the output current can be increased without enlarging the optical power supply converter 1C. Further, since the incident directions of light from the plurality of optical fiber cables are parallel, the optical fiber cables can be connected compactly without bending.

The operations and effects of the optical power supply converters 1A to 1C will be described.

The optical power supply converters 1A to 1C superimpose the light incident on the main surface 10a and the light incident on the inclined end surface 10c on the light receiving section 15, and convert the light into electric current by the light receiving section 15, and supply to the outside. Therefore, the light emitted from the plurality of optical fiber cables can be received to supply electric current without enlarging the optical power supply converters 1A to 1C.

The optical power supply converters 1B and 1C each include reflection portions 21, 31 facing the inclined end faces 10c, etc. Then, the light parallel to the light perpendicularly incident on the main surface 10a and incident on the reflecting portions 21, 31 is reflected by the reflecting portions 21, 31 toward the corresponding inclined end surfaces 10c, etc. Therefore, the emission points O1, 02B, 02C, etc. of the plurality of optical fiber cables can be arranged so as to emit in the direction perpendicular to the main surface 10a, and the optical fiber cables do not need to be bent. The optical fiber cable can be easily connected to 1B, 1C and can be connected compactly.

The support substrate of the optical power supply converter 1C is a silicon substrate 30, and the reflecting portion 31 etc. are formed on the (111) plane of the silicon substrate 30. Since the reflecting portion 31 etc. can be formed flat at a constant inclination angle, it is possible to form the reflecting portion 31 having high accuracy of the incident angle to the inclined end surface 10c and having high reflectance. Therefore, the light reflected by the highly reflective reflecting portion 31 can be superimposed on the light perpendicularly incident on the main surface 10a and incident on the light receiving section 15 with high accuracy. It can receive light from multiple optical fiber cables and supply power without enlarging the optical power supply converter 1C.

An example of the optical power supply converters 1A to 1C formed on the n-InP substrate as the semiconductor substrate 10 has been described, but the configuration of the present invention is not limited to this, and optical power supply converter formed on, for example, a silicon substrate or a GaAs substrate can be used. In addition, a person skilled in the art can carry out the embodiment in a form in which various modifications are added to the above embodiment without departing from the spirit of the present invention, and the present invention also includes such modified forms.

DESCRIPTION OF REFERENCE NUMERALS 1A-1C: optical power supply converter
2: semiconductor light receiving element
3: support board
4, 5: wiring
6: optical fiber cable
10: semiconductor substrate
10a: main surface
10b: back surface
10c-10f: inclined end surface
11: InGaAs layer
11a: light absorption area
12: n-InP layer
12a: p-type diffusion region
13: dielectric film
15: light receiving section
16: circular electrode
17: substrate electrode
21-24: reflecting portion
30: silicon substrate
31-34: reflecting portion
01~05, 02B~05B, 02C~05C: exit point

The invention claimed is:

1. An optical power supply converter having a semiconductor light receiving element comprising a light receiving section on a main surface of a semiconductor substrate, the light receiving section on the main surface being configured to receive light from outside the optical power supply converter, the optical power supply converter being configured to supply to outside thereof a current generated by converting light incident to the light receiving section on the main surface; wherein
  the semiconductor substrate has an exposed back surface and four exposed inclined end surfaces each of which intersects the main surface at an acute angle;
  the semiconductor substrate is configured so that light incident on the back surface is refracted so as to be incident perpendicular to the light receiving section on the main surface and light incident on each inclined end surface from a parallel direction or an oblique direction with respect to the main surface is refracted so as to be incident on the light receiving section on the main surface and overlap with the light incident perpendicular to the light receiving section on the main surface;
  a support substrate for supporting the semiconductor light receiving element is provided,
  the support substrate is provided with four reflecting portions each spaced from a respective one of the four inclined end surfaces, and
  each of the four reflecting portions is facing a respective one of the four inclined end surfaces and is configured to reflect light onto a respective one of the four inclined end surfaces.

2. The optical power supply converter according to claim 1, wherein the four reflecting portions are arranged each as a segment of a respective side of a same square and the reflecting portions are equidistantly spaced from the respective inclined end surfaces.

3. The optical power supply converter according to claim 1, wherein the support substrate is a silicon substrate.

* * * * *